(12) United States Patent
Tanabe et al.

(10) Patent No.: US 9,955,579 B2
(45) Date of Patent: Apr. 24, 2018

(54) PRINTED CIRCUIT BOARD HAVING REDUCED LOSS OF ELECTRIC SIGNAL AND METHOD OF MANUFACTURING THE SAME

(71) Applicant: Nitto Denko Corporation, Ibaraki-shi, Osaka (JP)

(72) Inventors: Hiroyuki Tanabe, Ibaraki (JP); Daisuke Yamauchi, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

(21) Appl. No.: 15/057,518

(22) Filed: Mar. 1, 2016

(65) Prior Publication Data
US 2016/0262265 A1    Sep. 8, 2016

(30) Foreign Application Priority Data
Mar. 3, 2015    (JP) ................................. 2015-041711

(51) Int. Cl.
| | |
|---|---|
| H05K 1/09 | (2006.01) |
| H05K 1/11 | (2006.01) |
| H05K 3/18 | (2006.01) |
| H05K 3/40 | (2006.01) |
| H05K 1/02 | (2006.01) |
| H05K 3/38 | (2006.01) |
| G11B 5/48 | (2006.01) |
| H05K 3/00 | (2006.01) |
| H05K 3/28 | (2006.01) |

(52) U.S. Cl.
CPC ................ *H05K 1/11* (2013.01); *G11B 5/484* (2013.01); *H05K 1/0242* (2013.01); *H05K 3/181* (2013.01); *H05K 3/384* (2013.01); *H05K 3/40* (2013.01); *H05K 1/09* (2013.01); *H05K 1/111* (2013.01); *H05K 3/0061* (2013.01); *H05K 3/285* (2013.01); *H05K 2201/0154* (2013.01); *H05K 2201/09081* (2013.01); *H05K 2201/10931* (2013.01); *H05K 2203/072* (2013.01)

(58) Field of Classification Search
CPC ........ H05K 1/11; H05K 1/0242; H05K 3/181; H05K 3/384; H05K 3/40; G11B 5/484
USPC .................... 174/251, 250, 255–259, 261
See application file for complete search history.

(56) References Cited

U.S. PATENT DOCUMENTS

| | | | |
|---|---|---|---|
| 2013/0284498 A1 | 10/2013 | Sugimoto et al. | |
| 2015/0245472 A1* | 8/2015 | Tanabe ................ | H05K 1/0266 174/251 |

FOREIGN PATENT DOCUMENTS

JP    2013232261 A    11/2013

* cited by examiner

*Primary Examiner* — Tremesha S Willis
(74) *Attorney, Agent, or Firm* — Panitch Schwarze Belisario & Nadel LLP

(57) ABSTRACT

A printed circuit board includes first and second insulating layers, a wiring trace, a metal thin film, and a connection terminal. The wiring trace is formed on the first insulating layer. The metal thin film is formed on the wiring trace, and has a thickness larger than 0 nm and not more than 150 nm. The second insulating layer is formed on the first insulating layer to cover the metal thin film. The connection terminal is formed on the first insulating layer to be electrically connected to the wiring trace and exposed from the second insulating layer.

19 Claims, 9 Drawing Sheets

F I G. 9A
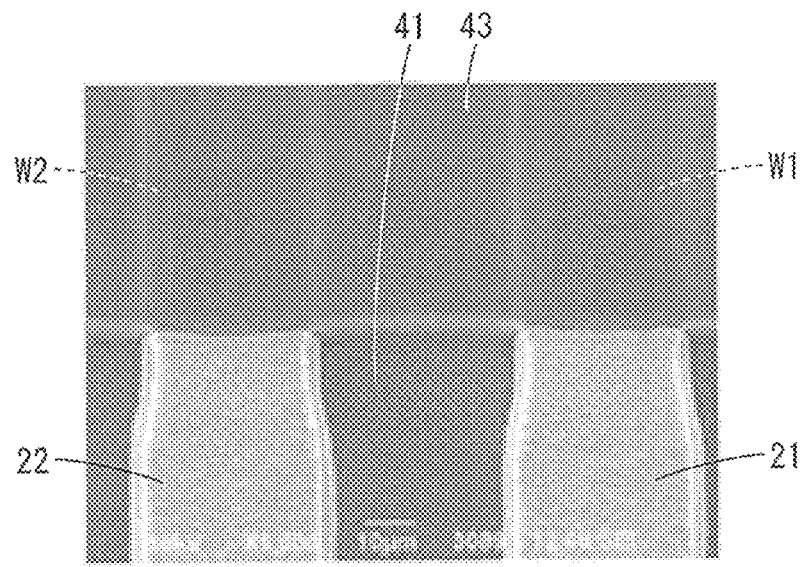
F I G. 9B
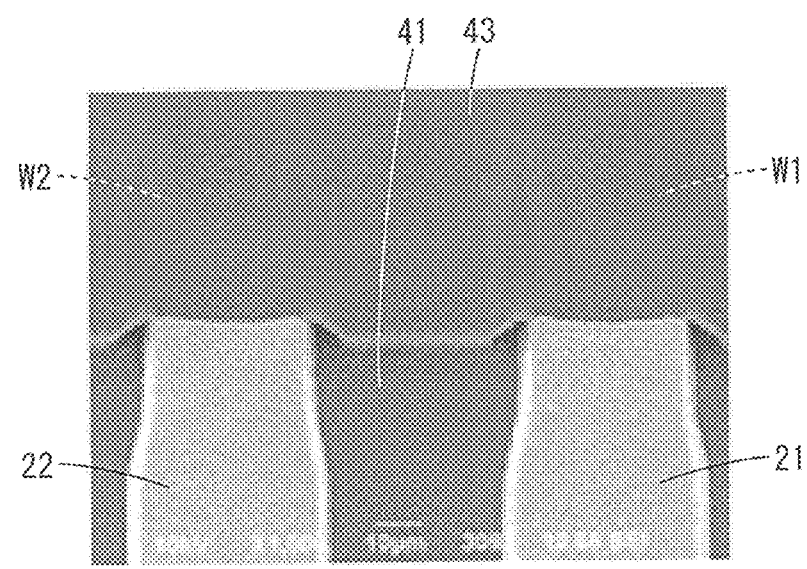

PRINTED CIRCUIT BOARD HAVING REDUCED LOSS OF ELECTRIC SIGNAL AND METHOD OF MANUFACTURING THE SAME

BACKGROUND OF THE INVENTION

Field of the Invention

The present invention relates to a printed circuit board and a method of manufacturing the printed circuit board.

Description of Related Art

Conventionally, a printed circuit board is used in various types of electric appliances and electronic appliances. In JP 2013-232261 A, a suspension board having a circuit is shown as a printed circuit board used for positioning a magnetic head in a magnetic disc device.

In a printed circuit board described in JP 2013-232261 A, an insulating layer is formed on a conductive support substrate. A conductor circuit pattern is formed on the insulating layer. A connection terminal is formed at the end of the conductor circuit pattern. A cover layer is formed on the insulating layer to cover the conductor circuit pattern and expose the connection terminal.

BRIEF SUMMARY OF THE INVENTION

In recent years, a frequency of an electric signal used for electric appliances or electronic appliances has increased. Therefore, in the high frequency band, it is required that a loss of the electric signal transmitted by the conductor circuit pattern of the printed circuit board is reduced.

An object of the present invention is to provide a printed circuit board in which a loss of an electric signal is reduced also in a high frequency band, and a method of manufacturing the printed circuit board.

Generally, in the case where the cover layer is formed on a wiring trace, a metal thin film is formed between the wiring trace and the cover layer in order to improve adhesion between the wiring trace and the cover layer. The inventors of the present application have discovered that a loss of an electric signal transmitted by the wiring trace in a high frequency band increases in the case where the metal thin film is formed on the wiring trace.

On the one hand, as a result of various experiments and studies, the inventors of the present application acquired new findings that it is possible to reduce a transmission loss of an electric signal in a high frequency band by reducing the thickness of the metal thin film formed on a surface of the wiring trace to be smaller than a constant value. Further, the inventors of the present application acquired new findings that adhesion between the wiring trace and the cover layer is hardly reduced even in the case where the thickness of the metal thin film is reduced. The inventors of the present application realized the present invention described below based on these new findings.

(1) According to one aspect of the present invention, a printed circuit board includes a first insulating layer, a wiring trace formed on the first insulating layer, a metal thin film formed on the wiring trace, a second insulating layer formed on the first insulating layer to cover the metal thin film, and a connection terminal electrically connected to the wiring trace, and formed on the first insulating layer to be exposed from the second insulating layer, wherein the metal thin film has a thickness larger than 0 nm and not more than 150 nm.

In this printed circuit board, the wiring trace is formed on the first insulating layer. The metal thin film having a thickness larger than 0 nm and not more than 150 nm is formed on the wiring trace. The second insulating layer is formed on the first insulating layer to cover the metal thin film. The connection terminal is formed on the first insulating layer to be electrically connected to the wiring trace and exposed from the second insulating layer.

In this configuration, the thickness of the metal thin film formed on the wiring trace is small. As a result of the above-mentioned experiments and studies by the inventors of the present application, the metal thin film has a small thickness of not more than 150 nm, an that a transmission loss of the electric signal is reduced. Thus, a transmission loss of the electric signal can be reduced also in the high frequency band.

(2) The metal thin film may have a thickness smaller than 100 nm. In this case, a transmission loss of the electric signal can be more sufficiently reduced also in the high frequency band.

(3) The metal thin film may have a thickness smaller than 50 nm. In this case, a transmission loss of the electric signal can be more sufficiently reduced also in the high frequency band.

(4) The metal thin film may have a thickness of not less than 10 nm. In this case, adhesion between the wiring trace and the second insulating layer is hardly reduced. Thus, the second insulating layer can be sufficiently prevented from being stripped from the wiring trace.

(5) An adhesive force of the metal thin film to the second insulating layer may be higher than an adhesive force of the wiring trace to the second insulating layer.

In this case, the adhesion between the wiring trace and the second insulating layer can be reliably improved by the metal thin film.

(6) The wiring trace may include copper, and the metal thin film includes nickel, gold, platinum, silver or tin.

In this case, the metal thin film including nickel, gold, platinum, silver or tin is interposed between the wiring trace including copper and the second insulating layer, an that the adhesion between the wiring trace and the second insulating layer is sufficiently improved.

(7) The connection terminal may include a first conductor layer integrally connected to the wiring trace, and a second conductor layer formed on the first conductor layer, and the first conductor layer may have a thickness smaller than a thickness of the wiring trace.

In the step of manufacturing the printed circuit board, the metal thin film is formed on the wiring trace and the first conductor layer integrally connected to each other. Further, the second conductor layer is formed on the first conductor layer after the metal thin film on the first conductor layer is removed, so that the connection terminal is formed. In this step, when the metal thin film on the first conductor layer is removed, a surface of the first conductor layer that comes into contact with the metal thin film is removed. Therefore, the thickness of the first conductor layer is smaller than the thickness of the wiring trace.

This configuration reliably prevents the metal thin film from remaining on the first conductor layer. Thus, the second conductor layer can be evenly formed.

(8) According to another aspect of the present invention, a method of manufacturing a printed circuit board includes the steps of forming a wiring trace on a first insulating layer, forming a metal thin film having a thickness larger than 0 nm and not more than 150 nm on the wiring trace, forming a second insulating layer on the first insulating layer to cover the metal thin film, and forming a connection terminal on the first insulating layer to be electrically connected to the wiring trace and exposed from the second insulating layer.

In this method of manufacturing the printed circuit board, the wiring trace is formed on the first insulating layer. The metal thin film having a thickness larger than 0 nm and not more than 150 nm is formed on the wiring trace. The second insulating layer is formed on the first insulating layer to cover the metal thin film. The connection terminal is formed on the first insulating layer to be electrically connected to the wiring trace and exposed from the second insulating layer.

In this configuration, the thickness of the metal thin film formed on the wiring trace is small. As a result of the above-mentioned experiments and studies by the inventors of the present application, the thickness of the metal thin film is small and not more than 150 nm, so that a transmission loss of an electric signal is reduced. Thus, a transmission loss of the electric signal can be reduced also in the high frequency band.

(9) The metal thin film may have a thickness smaller than 100 nm. In this case, a transmission loss of the electric signal can be more sufficiently reduced also in the high frequency band.

(10) The metal thin film may have a thickness smaller than 50 nm. In this case, a transmission loss of the electric signal can be more sufficiently reduced also in the high frequency band.

(11) The metal thin film may have a thickness of not less than 10 nm. In this case, adhesion between the wiring trace and the second insulating layer is hardly reduced. Thus, the second insulating layer can be reliably prevented from being stripped from the wiring trace.

(12) The step of forming the wiring trace may include forming a first conductor layer integrally connected to the wiring trace, the step of forming the metal thin film includes forming the metal thin film on the wiring trace and the first conductor layer, and removing the metal thin film formed on the first conductor layer, and the step of forming the connection terminal may include forming a second conductor layer on the first conductor layer.

In this case, the metal thin film can be easily formed only between the wiring trace and the second insulating layer.

(13) Removing the metal thin film may include removing a surface of the first conductor layer that comes into contact with the metal thin film.

In this case, the metal thin film is reliably prevented from remaining on the first conductor layer. Thus, an increase in loss of the electric signal in the connection terminal can be reliably prevented.

(14) The step of forming the metal thin film may include forming the metal thin film by electroless plating. In this case, the metal thin film can be easily formed on the wiring trace.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIGS. 9A and 9B are enlarged images of part of the suspension board imaged using a microscope.

DESCRIPTION OF THE PREFERRED EMBODIMENTS

A printed circuit board and a method of manufacturing the printed circuit board according to one embodiment of the present invention will be described below with reference to drawings. A suspension board having a circuit used for an actuator of a hard disc drive device (hereinafter abbreviated as a suspension board) will be described as the printed circuit board according to the one embodiment of the present invention.

(1) Configuration of Suspension Board

Figure 1:
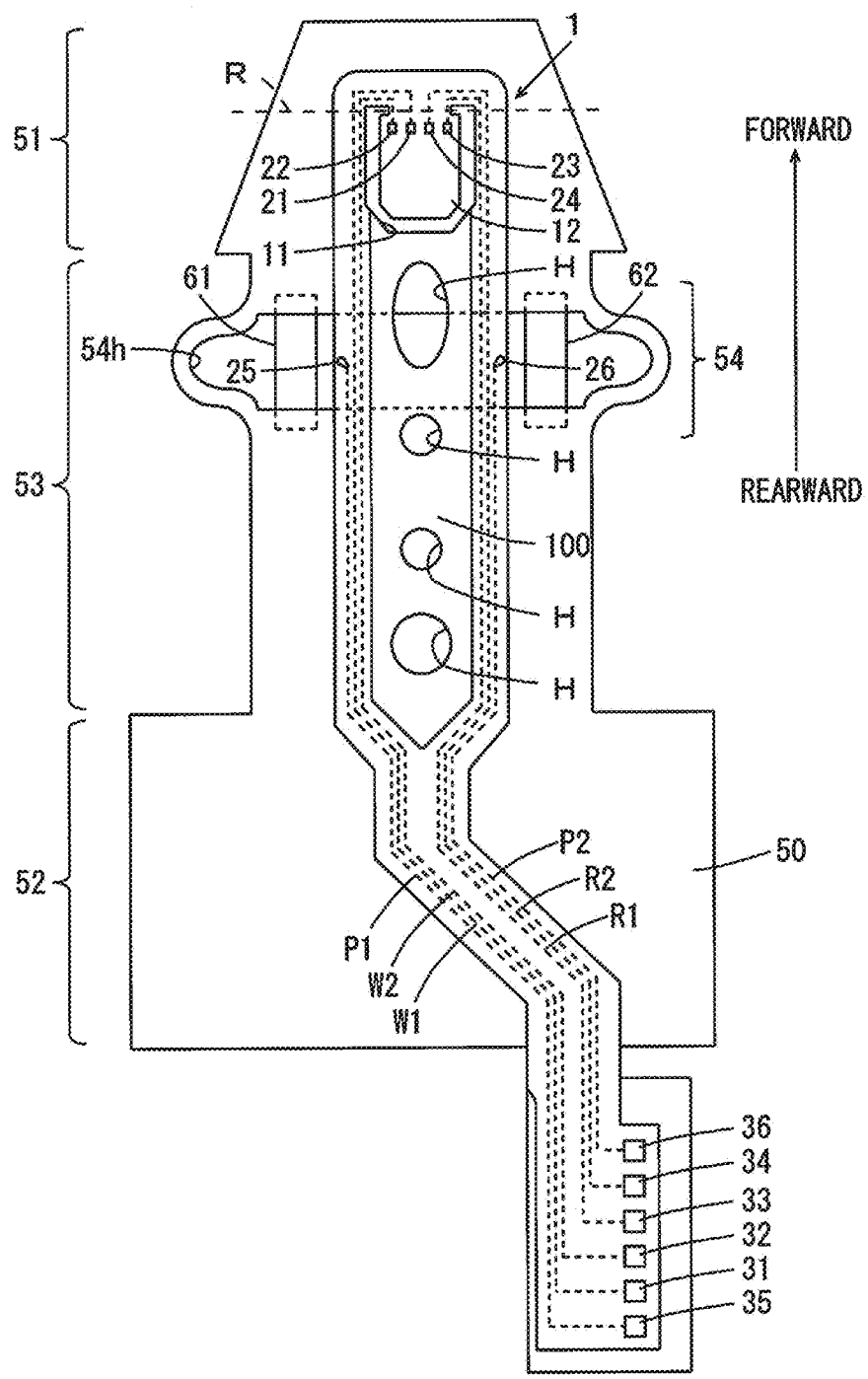
FIG. 1 is a plan view of a suspension board according to one embodiment of the present invention.

FIG. 1 is a plan view of the suspension board according to the one embodiment of the present invention. In FIG. 1, a direction in which an arrow is directed is referred to as forward, and the opposite direction is referred to as rearward. As shown in FIG. 1, the suspension board 1 includes a suspension body 100 formed of an elongated metallic support substrate. In FIG. 1, the suspension body 100 extends in a substantially front-and-rear direction.

The suspension board 1 is supported by an elongated support plate 50. As indicated by dotted lines, write wiring traces W1, W2, read wiring traces R1. R2 and power wiring traces P1, P2 are formed on an upper surface of the suspension body 100.

At a tip end of the suspension body 100, a magnetic head supporting portion (hereinafter referred to as a tongue) 12 is provided by forming a U-shaped opening 11. The tongue 12 is bent along a broken line R to form a predetermined angle with the suspension body 100.

Four connection terminals 21, 22, 23, 24 are formed on an upper surface of the tongue 12 at one end of the suspension body 100. Further, two connection terminals 25, 26 are respectively formed on both sides in the vicinity of the center portion in a direction in which the suspension body 100 extends. Ahead slider having a magnetic head (not shown) is mounted on the upper surface of the tongue 12. Terminals of the magnetic head of the head slider are connected to the connection terminals 21 to 24 of the tongue 12. The connection terminals 25, 26 are respectively connected to two piezoelectric elements 61, 62 that are provided at the support plate 50.

Six connection terminals 31, 32, 33, 34, 35, 36 are formed on an upper surface at the other end of the suspension body 100. Electric circuits such as a preamplifier are connected to the connection terminals 31 to 34. Power circuits for the piezoelectric elements 61, 62 are connected to the connection terminals 35, 36. The connection terminals 21 to 26 are respectively electrically connected to the connection terminals 31 to 36 by the write wiring traces W1, W2, the read wiring traces R1/R2 and the power wiring traces P1, P2. Further, a plurality of holes H are formed in the suspension body 100.

The support plate 50 has a front end region 51, a rear end region 52 and a center region 53. The front end region 51 is trapezoidal, and its width is gradually reduced forward. The rear end region 52 is rectangular. The center region 53 has a rectangular shape extending in the front-and-rear direction, and is arranged between the front end region 51 and the rear end region 52. With the suspension board 1 being supported by an upper surface of the support plate 50, an end portion of the suspension board 1 including the connection terminals 31 to 36 projects rearward from the rear end region 52.

A piezoelectric element mounting region 54 is provided in one portion of the center region 53. The piezoelectric element mounting region 54 overlaps with the connection terminals 25, 26 of the suspension board 1. Both of side portions of the piezoelectric element mounting region 54 project to be curved outward. Further, a through hole 54h extending in a width direction (a direction orthogonal to the front-and-rear direction) is formed in the piezoelectric element mounting region 54. In this configuration, the piezoelectric element mounting region 54 of the support plate 50 is stretchable in the front-and-rear direction.

The piezoelectric elements 61, 62 are mounted on a lower surface of the piezoelectric element mounting region 54 so as to cross the through hole 54h. The piezoelectric elements 61, 62 are respectively positioned on both sides of the suspension board 1. The piezoelectric elements 61, 62 are respectively connected to the connection terminals 25, 26 of the suspension board 1 through the through hole 54h.

A voltage is added to the piezoelectric element 61 via the connection terminals 25, 35 and the power wiring trace P1, and a voltage is added to the piezoelectric element 62 via the connection terminals 26, 36 and the power wiring trace P2. Thus, with a stretch of the piezoelectric elements 61, 62, the support plate 50 is stretched in the front-and-rear direction. It is possible to subtly position the magnetic head of the head slider on the suspension board 1 by controlling the voltages added to the piezoelectric elements 61, 62.

The suspension board 1 supported by the support plate 50 is provided in the hard disc device. An electric current flows in the pair of write wiring traces W1, W2 at a time of writing the information in a magnetic disc. The write wiring trace W1 and the write wiring trace W2 constitute a differential signal line pair that transmits differential write signals. Further, an electric current flows in the pair of read wiring traces R1, R2 at a time of reading the information from the magnetic disc. The read wiring trace R1 and the read wiring trace R2 constitute a differential signal line pair that transmits differential read signals.

(2) Configuration of Connection Terminals and their Peripheral Portions

Figure 2A:
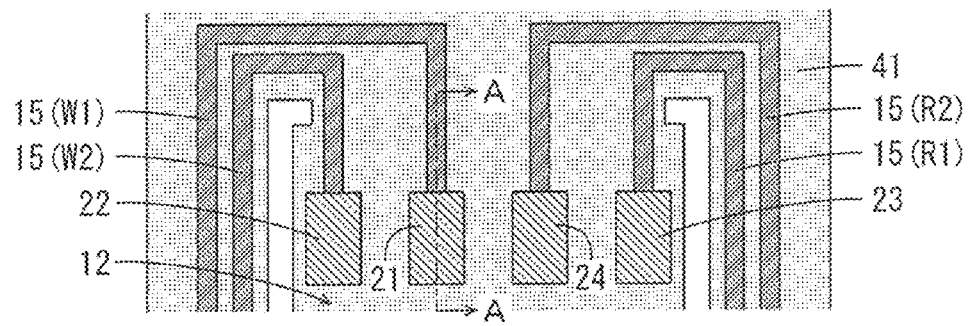
FIGS. 2A to 2C are plan views of connection terminals and their peripheral portions.
Figure 2B:
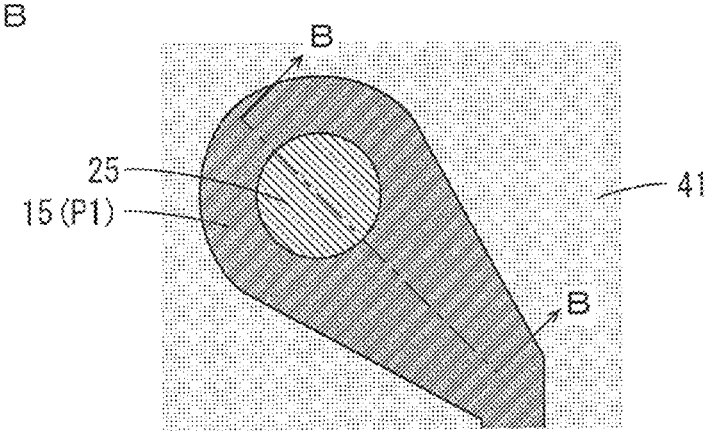
Figure 2C:
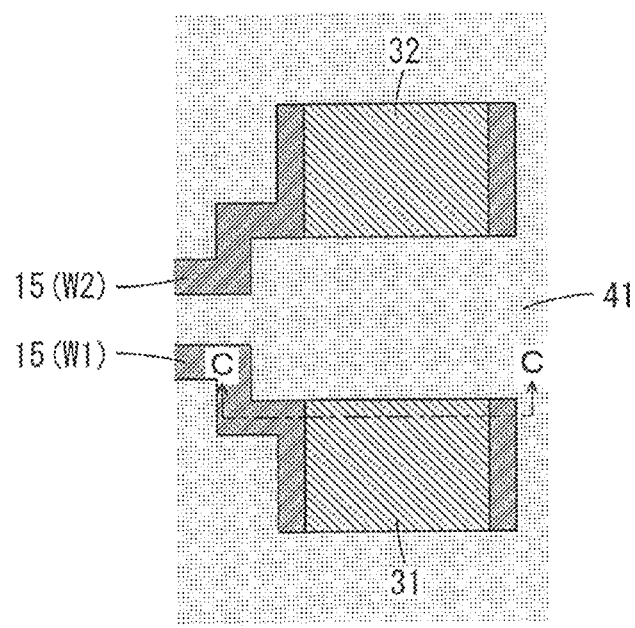
Figure 3A:
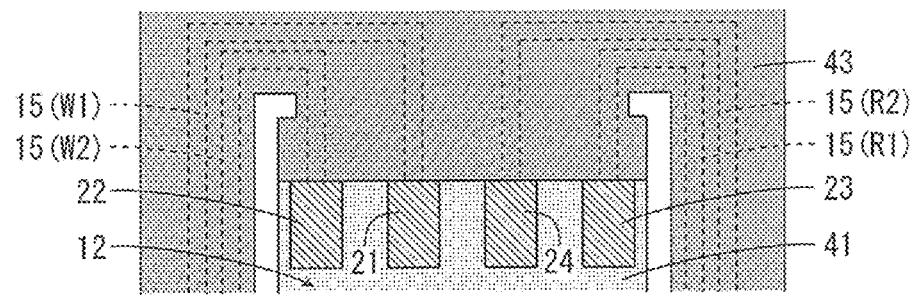
FIGS. 3A to 3C are plan views of the connection terminals and their peripheral portions.
Figure 3B:
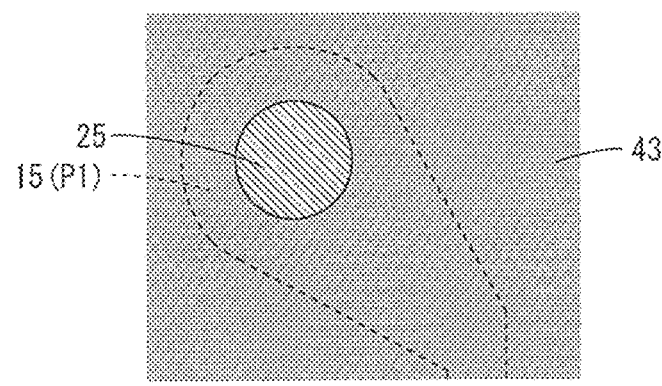
Figure 3C:
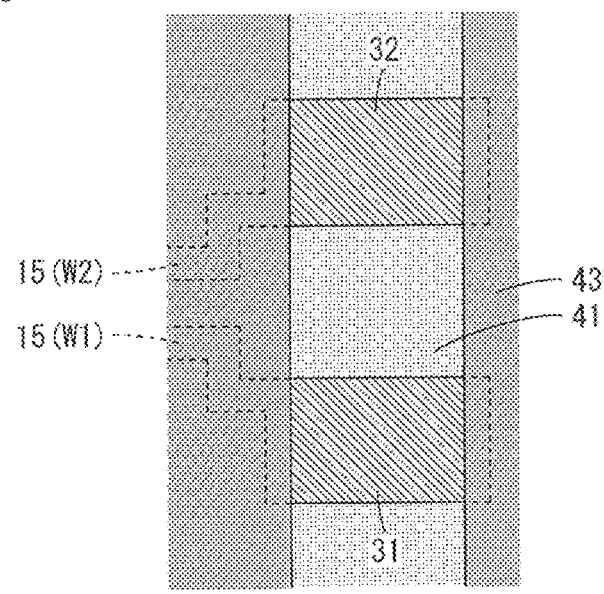
Figure 4A:
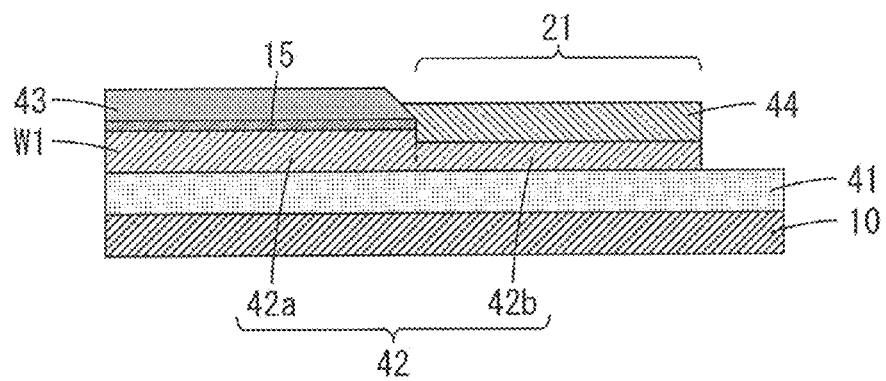
FIGS. 4A to 4C are cross sectional views of the connection terminals and their peripheral portions.
Figure 4B:
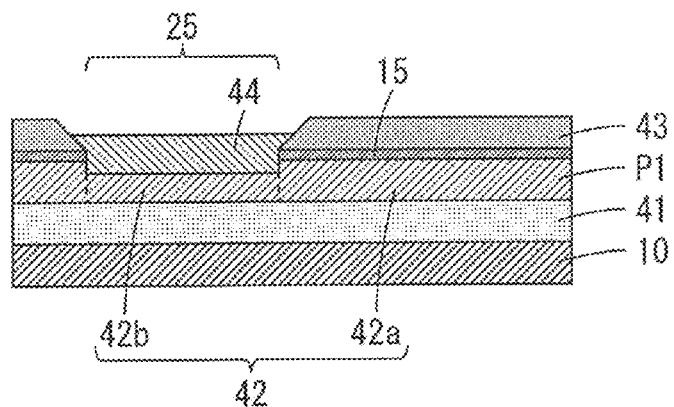
Figure 4C:
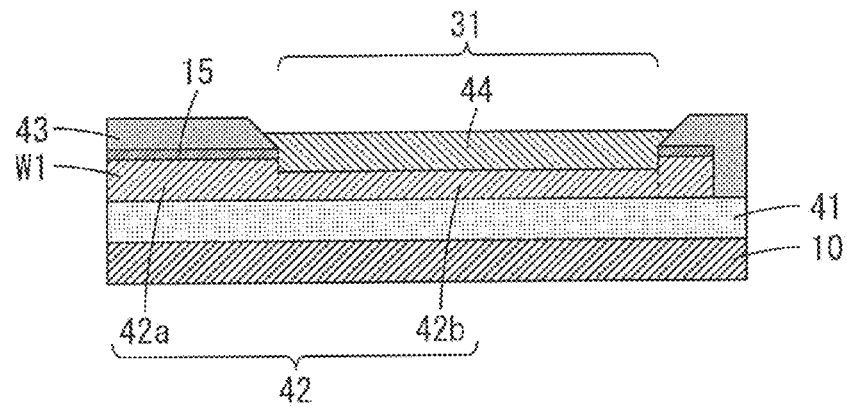

Next, details of the connection terminals 21 to 26, 31 to 36 of the suspension board 1 and their peripheral portions will be described, FIGS. 2A to 3C are plan views of the connection terminals 21 to 26, 31 to 36 and their peripheral portions. FIGS. 4A to 4C are cross sectional views of the connection terminals 21 to 26, 31 to 36 and their peripheral portions. Scales of FIGS. 2A to 2C are different from one another, scales of FIGS. 3A to 3C are different from one another, and scales of FIGS. 4A to 4C are different from one another.

FIG. 2A and FIG. 3A show the connection terminals 21 to 24 and their peripheral portions, FIG. 2B and FIG. 3B show the connection terminal 25 and its peripheral portions, and FIG. 2C and FIG. 3C show the connection terminals 31, 32 and their peripheral portions. In FIGS. 2A to 2C, a cover layer 43 (see FIGS. 4A to 4C) is not shown. The connection terminal 26 has the configuration similar to that of the connection terminal 25, and the connection terminals 33 to 36 have the configuration similar to that of the connection terminals 31, 32.

FIGS. 4A to 4C respectively show an enlarged cross sectional view taken along the line A-A of FIG. 2A, an enlarged cross sectional view taken along the line B-B of FIG. 2B, and an enlarged cross sectional view taken along the line C-C of FIG. 2C. The same hatched and dotted patterns applied to each member of the cross sectional views of FIGS. 4A to 4C are applied to the members of the plan views of FIGS. 2A to 2C and FIGS. 3A to 3C in order to facilitate understanding of the configuration. This also applies to the below-mentioned FIGS. 5A to 6C.

As shown in FIG. 2A, the connection terminals 21 to 24 are respectively formed at one ends of the write wiring traces W1, W2 and the read wiring traces R1, R2. As shown in FIG. 2B, the connection terminal 25 is formed at one end of the power wiring trace P1. Similarly, the connection terminal 26 (FIG. 1) is formed at one end of the power wiring trace P2 (FIG. 1). As shown in FIG. 2C, the connection terminals 31, 32 are respectively formed at the other ends of the write wiring traces W1, W2. Similarly, the connection terminals 33 to 36 (FIG. 1) are formed at the other ends of the read wiring traces R1, R2 (FIG. 1) and power wiring traces P1, P2 (FIG. 1).

As shown in FIGS. 2A to 2C, a metal thin film 15 is formed on the write wiring traces W1, W2, read wiring traces R1, R2, and power wiring traces P1, P2. In the present embodiment, the metal thin film 15 is formed on the entire write wiring traces W1. W2, read wiring traces R1, R2 and power wiring traces P1, P2 between the connection terminals 21 to 26 and the connection terminals 31 to 36.

As shown in FIGS. 3A to 3O, the cover layer 43 made of polyimide, for example, is formed on an insulating layer 41 to cover the metal thin film 15 on the write wiring traces W1, W2, read wiring traces R1, R2, and power wiring traces P1, P2. The connection terminals 21 to 26, 31 to 36 are exposed from the cover layer 43.

As shown in FIG. 4A, the insulating layer 41 made of polyimide, for example, is formed on a metallic support substrate 10 made of stainless steel, for example. A conductor layer 42 made of copper, for example, is formed on the insulating layer 41. The conductor layer 42 includes a pattern portion 42a and a terminal portion 42b. In FIG. 4A, a boundary between the pattern portion 42a and the terminal portion 42b is indicated by a dotted line. This also applies to the FIGS. 4B and 4C, and FIGS. 7B to 8C, described below.

The write wiring trace W1 is formed of the pattern portion 42a. The metal thin film 15 is formed on the write wiring trace W1. In the present embodiment, the metal thin film 15 is formed on an upper surface and a side surface of the pattern portion 42a of the write wiring trace W1. The metal thin film 15 is a nickel thin film formed by electroless plating, for example.

The thickness of the metal thin film 15 is larger than 0 nm and not more than 150 nm. The thickness of the metal thin film 15 is preferably not less than 10 nm. In this case, adhesion between the pattern portion 42a and the cover layer 43 is hardly reduced. Thus, the cover layer 43 is sufficiently prevented from being stripped from the pattern portion 42a. Further, the thickness of the metal thin film 15 is preferably smaller than 100 nm. In this case, a transmission loss of an electric signal can be more sufficiently reduced also in a high frequency band. Further, the thickness of the metal thin film 15 is more preferably smaller than 50 nm. In this case, a transmission loss of the electric signal can be more sufficiently reduced also in the high frequency band.

In particular, the thickness of the metal thin film 15 is preferably larger than 0 nm and smaller than 100 nm, and is preferably larger than 0 nm and smaller than 50 nm. The thickness of the metal thin film 15 is more preferably not less than 10 nm and smaller than 100 nm, and is even more preferably not less than 10 nm and smaller than 50 nm.

The cover layer 43 made of polyimide, for example, is formed on the insulating layer 41 to cover the metal thin film 15 on the write wiring trace W1. Further, a metal layer 44 made of nickel and gold (Au), for example, is formed on the terminal portion 42b exposed from the cover layer 43. The connection terminal 21 is constituted by the terminal portion 42b and the metal layer 44.

The configuration of a boundary portion between the write wiring trace W2 and the connection terminal 22, a boundary portion between the read wiring trace R1 and the connection terminal 23, and a boundary portion between the read wiring trace R2 and the connection terminal 24 are similar to the configuration of a boundary portion between the write wiring trace W1 and the connection terminal 21 of FIG. 4A.

Similarly, as shown in FIG. 4B, the power wiring trace P1 is formed of the pattern portion 42a of the conductor layer 42. The metal thin film 15 is formed on the power wiring trace P1. In the present embodiment, the metal thin film 15 is formed on an upper surface and a side surface of the pattern portion 42a of the power wiring trace P1.

The cover layer 43 is formed on the insulating layer 41 to cover the metal thin film 15 on the power wiring trace P1. Further, the metal layer 44 is formed on the terminal portion 42b exposed from the cover layer 43. The connection terminal 25 is constituted by the terminal portion 42b and the metal layer 44. In the present example, the power wiring trace P1 is circular.

The configuration of a boundary portion between the power wiring trace P2 and the connection terminal 26 is similar to the configuration of a boundary portion between the power wiring trace P1 and the connection terminal 25 of FIG. 4B.

As shown in FIG. 4C, the write wiring trace W1 is formed of the pattern portion 42a at the other end of the suspension body 100. The metal thin film 15 is formed on the pattern portion 42a. In the present embodiment, the metal thin film 15 is formed on the upper surface and the side surface of the pattern portion 42a of the write wiring trace W1.

The cover layer 43 is formed on the insulating layer 41 to cover the metal thin film 15 on the write wiring trace W1. Further, the metal layer 44 is formed on the terminal portion 42b exposed from the cover layer 43. The connection terminal 31 is constituted by the terminal portion 42b and the metal layer 44.

The configuration of a boundary portion between the write wiring trace W2 and the connection terminal 32, a boundary portion between the read wiring trace R1 and the connection terminal 33, and a boundary portion between the read wiring trace R2 and the connection terminal 34 is similar to the configuration of a boundary portion between the write wiring trace W1 and the connection terminal 31 of FIG. 4C. Further, the configuration of a boundary portion between the power wiring trace P1 and the connection terminal 35 and a boundary portion between the power wiring trace P2 and the connection terminal 36 is similar to the configuration of a boundary portion between the write wiring trace W1 and the connection terminal 31.

(3) Method of Manufacturing Suspension Board

The method of manufacturing the suspension board 1 will be described below. FIGS. 5A to 8C are schematic diagrams showing the manufacturing process of the suspension board 1 of FIG. 1. FIGS. 5A to 6C show plan views of the connection terminals 21 to 24 and portions equivalent to its periphery. FIGS. 7A to 8C show cross sectional views taken along the D-D line of FIGS. 5A to 6C.

Figure 5A:
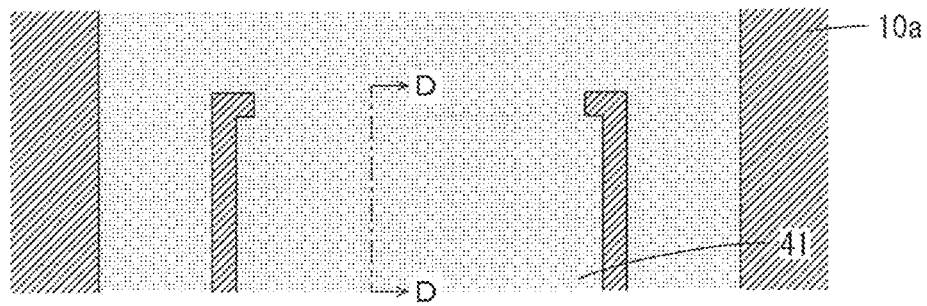
FIGS. 5A to 5D are schematic diagrams showing a manufacturing process of a suspension board of FIG. 1.
Figure 7A:
FIGS. 7A to 7D are schematic diagrams showing the manufacturing process of the suspension board of FIG. 1.

First, as shown in FIGS. 5A and 7A, the insulating layer 41 made of polyimide, for example, is formed on a support layer 10a made of stainless steel, for example. The thickness of the support layer 10a is not less than 10 μm and not more than 50 μm, for example. The thickness of the insulating layer 41 is not less than 5 μm and not more than 15 μm, for example. Here, the insulating layer 41 is formed in the same shape as the shape of the suspension board 1 of FIG. 1.

Figure 5B:
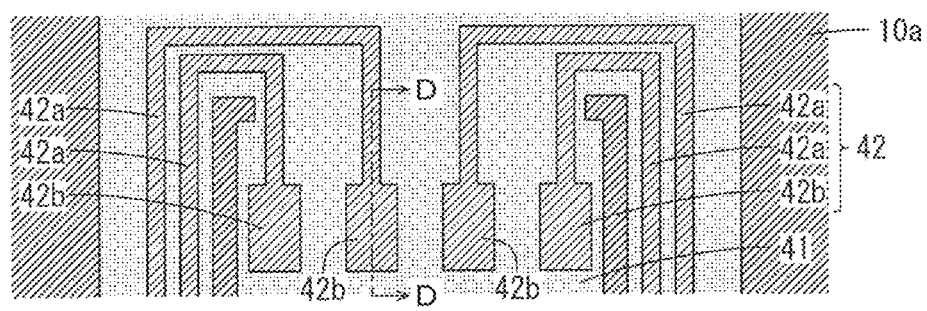
Figure 7B:

Next, as shown in FIGS. 5B and 7B, the conductor layer 42 made of copper, for example, is formed on the insulating layer 41. The conductor layer 42 has predetermined patterns. The thickness of the conductor layer 42 is not less than 1 μm and not more than 20 μm, for example. Portions of the conductor layer 42 in which the write wiring traces W1, W2, the read wiring traces R1, R2 and the power wiring traces P1, P2 are formed in the subsequent step are referred to as the pattern portions 42a as described above. Portions of the end portion of the conductor layer 42 in which the connection terminals 21 to 26, 31 to 36 are formed in the subsequent step are referred to as the terminal portions 42b as described above.

Figure 5C:
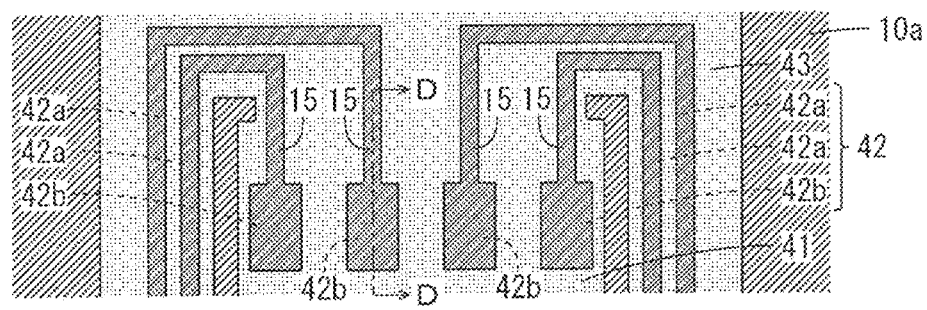
Figure 7C:
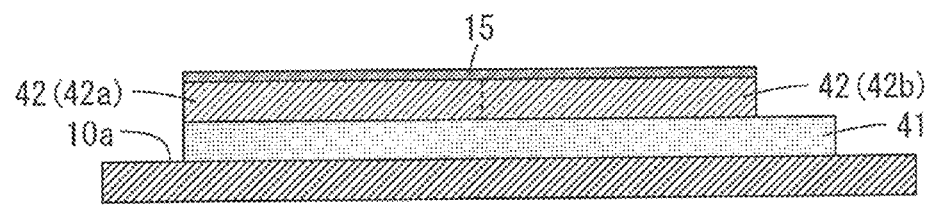

Then, as shown in FIGS. 5C and 7C, the thin metal film 15 is formed on the conductor layer 42. The thin metal film 15 is formed by electroless plating, for example. In a formation process of the electroless plating, with the conductor layer 42 being immersed in an electroless plating liquid including nickel and a reductant, for example, a nickel plating coating grows on the conductor layer 42 with a catalyst such as palladium being used as a core.

An adhesive force of the metal thin film 15 to the cover layer 43 is preferably higher than an adhesive force of the pattern portion 42a to the cover layer 43. In this case, adhesion between the pattern portion 42a and the cover layer 43 can be reliably improved by the metal thin film 15.

For example, the pattern portion 42a includes copper, and the metal thin film 15 preferably includes nickel. In this case, the metal thin film 15 including nickel is interposed between the pattern portion 42a including copper and the cover layer 43, so that adhesion between the pattern portion 42a and the cover layer 43 is sufficiently improved.

While the metal thin film 15 is preferably formed of nickel, the present invention is not limited to this. The metal thin film 15 may be formed of gold (Au), platinum (Pt), silver (Ag) or tin (Sn). Even in this case, the adhesion between the pattern portion 42a and the cover layer 43 can be improved.

Figure 5D:
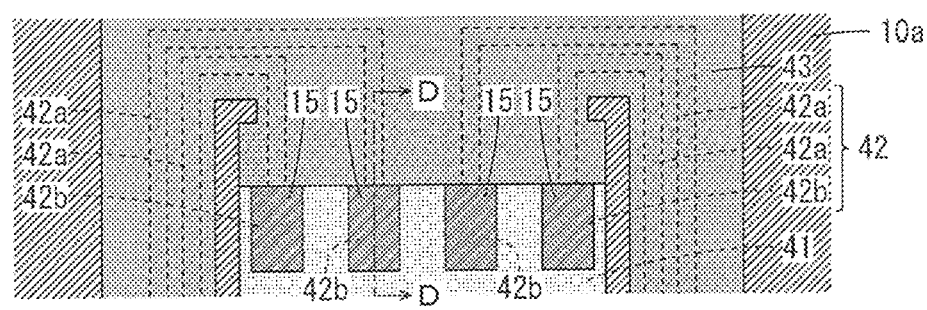
Figure 7D:
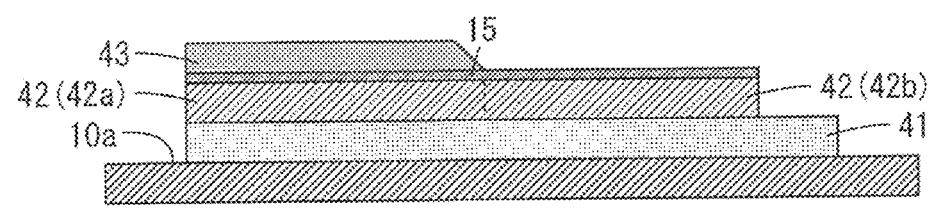

Then, as shown in FIGS. 5D and 7D, the cover layer 43 made of polyimide, for example, is formed on the insulating layer 41 to cover the metal thin film 15 on the pattern portion 42a. The thickness of the cover layer 43 is not less than 2 μm and not more than 10 μm, for example. Thus, the metal thin film 15 on the terminal portion 42b is exposed from the cover layer 43.

Figure 6A:
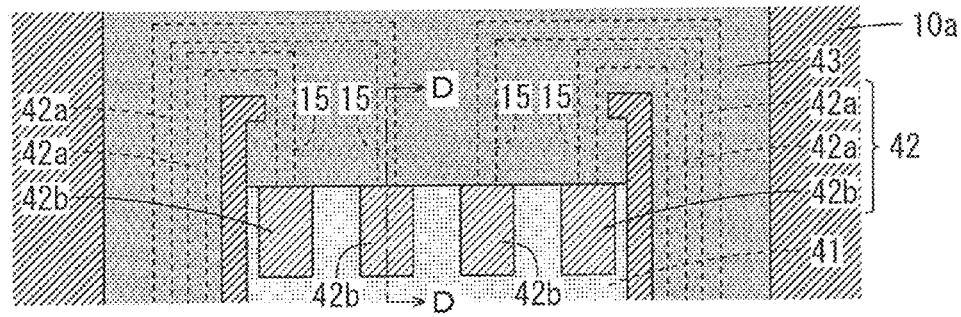
FIGS. 6A to 6C are schematic diagrams showing the manufacturing process of the suspension board of FIG. 1.
Figure 8A:
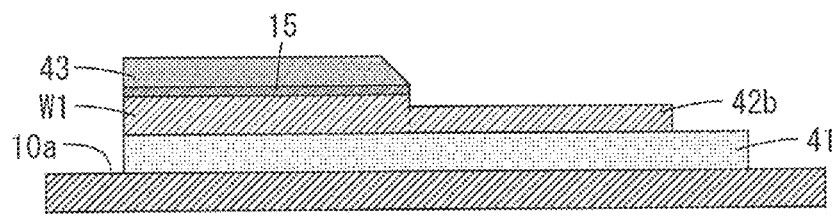
FIGS. 8A to 8C are schematic diagrams showing the manufacturing process of the suspension board of FIG. 1.

Thereafter, as shown in FIGS. 6A and 8A, the metal thin film 15 on the terminal portion 42b is removed. When the metal thin film 15 on the terminal portion 42b is removed, a surface of the terminal portion 42b that comes into contact with the metal thin film 15 is removed. Therefore, the thickness of the terminal portion 42b is slightly smaller than the thickness of the pattern portion 42a.

This configuration reliably prevents the metal thin film 15 from remaining on the terminal 42b. Thus, in the next step, the metal layer 44 can be evenly formed.

Figure 6B:
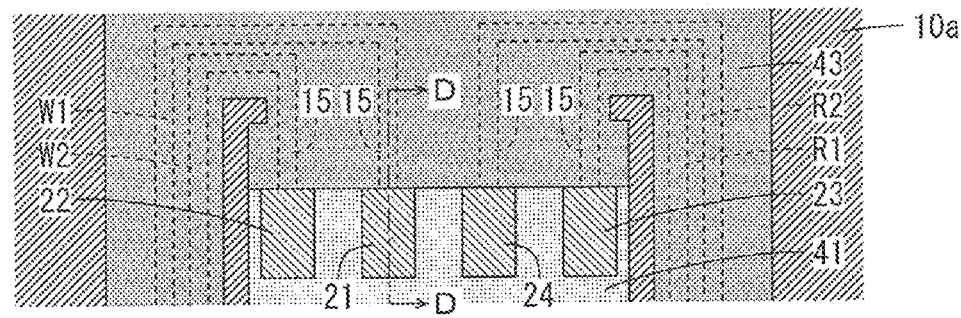
Figure 8B:
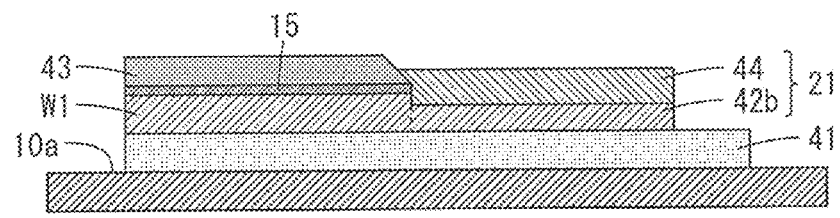

Subsequently, as shown in FIGS. 6B and 8B, the metal layer 44 is formed on the terminal portion 42b. In the present example, nickel plating having a thickness of not less than 0.01 μm and not more than 5 μm, and gold plating having a thickness of not less than 0.1 μm and not more than 5 μm are sequentially performed on the terminal portion 42b, whereby the metal layer 44 is formed. The connection terminals 21 to 26, 31 to 36 are formed by the terminal portion 42b and the metal layer 44, and the write wiring traces W1, W2, the read wiring traces R1, R2, and the power wiring traces P1, P2 are formed by the pattern portion 42a.

A distance between the write wiring traces W1, W2 and a distance between the read wiring traces R1, R2 are respectively not less than 5 μm and not more than 100 μm, for example. Similarly, a distance between the write wiring trace W1 and the power wiring trace P1 and a distance between the read wiring trace R2 and the power wiring trace P2 are respectively not less than 5 μm and not more than 100 μm, for example. The widths of the write wiring traces W1, W2, the read wiring traces R1, R2, and the power wiring traces P1, P2 are not less than 5 μm and not more than 200 μm, for example.

Figure 6C:
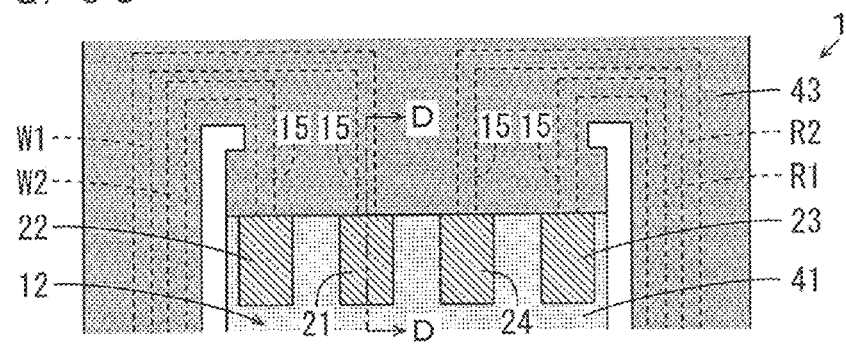
Figure 8C:
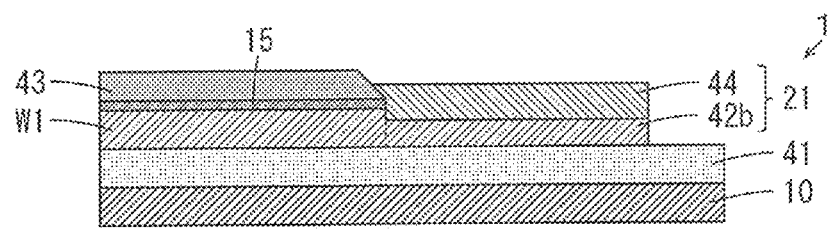

Thereafter, as shown in FIGS. 6C and 8C, the support layer 10a is processed such that a portion of the support layer 10a overlapping with the insulating layer 41 remains, whereby the support substrate 10 is formed. The process of the support layer 10a is performed by etching, for example. Thus, the suspension board 1 is completed.

(4) Other Embodiments (a) While the metal thin film 15 is formed on the entire pattern portion 42a in the above-mentioned embodiment, the present invention is not limited to this. The metal thin film 15 does not have to be formed on part of the pattern portion 42a.

(b) While the metal thin film 15 is formed on the upper surface and the side surface of the pattern portion 42a in the above-mentioned embodiment, the present invention is not limited to this. The metal thin film 15 may be formed only on the upper surface of the pattern portion 42a, or the upper surface and one side surface of the pattern portion 42a.

(c) In the above-mentioned embodiment, as shown in FIGS. 5D and 7D, when the metal thin film 15 on the terminal portion 42b is removed, a surface of the terminal portion 42b that comes into contact with the metal thin film 15 is removed. However, the present invention is not limited to this. Only the metal thin film 15 on the terminal portion 42b may be removed, and the surface of the terminal portion 42b that comes into contact with the metal thin film 15 does not have to be removed. Therefore, the thickness of the terminal portion 42b may be substantially equal to the thickness of the pattern portion 42a.

(d) While the thickness of the metal thin film 15 is constant in the above-mentioned embodiment, the present invention is not limited to this. The thickness of the pattern portion 42a does not have to be constant.

(e) While the printed circuit board is the suspension board 1 including the support substrate 10 in the above-mentioned embodiment, the present invention is not limited to this. The printed circuit board may be a flexible printed circuit board that does not include the support substrate 10, for example.

(f) While the metal thin film 15 is formed by electroless plating in the above-mentioned embodiment, the present invention is not limited to this. The metal thin film 15 may be formed using another method such as a semi-additive method or a subtractive method.

(5) Effects

In the suspension board 1 according to the present embodiment, the conductor layer 42 is formed on the insulating layer 41. The metal thin film 15 having a thickness larger than 0 nm and not more than 150 nm is formed on the pattern portion 42a of the conductor layer 42. The cover layer 43 is formed on the insulating layer 41 to cover the metal thin film 15 and expose the terminal portion 42b of the conductor layer 42. The metal layer 44 is formed on the terminal portion 42b, so that the connection terminals 21 to 26, 31 to 36 are formed.

In this configuration, the thickness of the metal thin film 15 formed on the pattern portion 42a is small. As a result of the above-mentioned experiments and studies by the inventors of the present application, the thickness of the metal thin film 15 is small such as not more than 150 nm, so that a transmission loss of the electric signal is reduced. Thus, a transmission loss of the electric signal can be reduced also in a high frequency band.

(6) Inventive Examples

In the inventive examples 1 to 11, and the comparative examples 1 to 4, the suspension boards having different thicknesses of the metal thin films 15 were fabricated based on the above-mentioned method of manufacturing the suspension board.

In the suspension board according to the inventive examples 1 to 4, the thicknesses of the metal thin film 15 are respectively 10 nm, 20 nm, 30 nm and 40 nm. In the suspension board according to the inventive examples 5 to 7, the thicknesses of the metal thin film 15 are respectively 50 nm, 70 nm and 90 nm. In the suspension board according to the inventive examples 8 to 11, the thicknesses of the metal thin film 15 are respectively 100 nm, 120 nm, 140 nm, and 150 nm.

In the suspension board according to the comparative example 1, the thickness of the metal thin film 15 is 0 nm. That is, in the suspension board according to the comparative example 1, the metal thin film 15 is not formed. In the suspension boards according to the comparative examples 2 to 4, the thicknesses of the metal thin film 15 are respectively 200 nm, 500 nm and 1000 nm.

Regarding the fabricated suspension boards according to the inventive examples 1 to 11 and the comparative examples 1 to 4, performance was evaluated. Results of evaluation are shown in the Table 1. In the evaluation of performance in the Table 1, "a" indicating that the performance is good is shown for an example in which band characteristics and adhesion are good. On the one hand, "x" indicating that the performance is bad is shown for an example in which the band characteristics or adhesion is bad.

TABLE 1

|  | Thickness [nm] | Band Characteristics | Adhesion | Performance |
|---|---|---|---|---|
| Inventive Example 1 | 10 | ◎ | ○ | ○ |
| Inventive Example 2 | 20 | ◎ | ○ | ○ |
| Inventive Example 3 | 30 | ◎ | ○ | ○ |
| Inventive Example 4 | 40 | ◎ | ○ | ○ |
| Inventive Example 5 | 50 | ○ | ○ | ○ |
| Inventive Example 6 | 70 | ○ | ○ | ○ |
| Inventive Example 7 | 90 | ○ | ○ | ○ |
| Inventive Example 8 | 100 | Δ | ○ | ○ |
| Inventive Example 9 | 120 | Δ | ○ | ○ |
| Inventive Example 10 | 140 | Δ | ○ | ○ |
| Inventive Example 11 | 150 | Δ | ○ | ○ |
| Comparative Example 1 | 0 | ◎ | X | X |
| Comparative Example 2 | 200 | X | ○ | X |
| Comparative Example 3 | 500 | X | ○ | X |
| Comparative Example 4 | 1000 | X | ○ | X |

In the evaluation of the band characteristics, a frequency in the case where a signal transmitted through the suspension board attenuates by 3 dB was measured. When a record density of a magnetic disc is considered, the frequency is preferably not less than 4.4 GHz. For an example in which the frequency is not less than 4.4 GHz, "Δ" indicating that the band characteristics are good is shown. Further, for an example in which the frequency is not less than 4.9 GHz, "○" indicating that the band frequencies are particularly good is shown. Further, for an example in which the frequency is not less than 5.4 GHz, "◎" indicating that the band characteristics are extremely good is shown. On the one hand, for an example in which the frequency is less than 4.4 GHz, "x" indicating that band characteristics are bad is shown.

FIGS. 9A and 9B are enlarged images of part of the suspension board imaged using a microscope. In the evaluation of the adhesion, for an example in which the cover layer 43 was not stripped from the write wiring traces W1, W2, the read wiring traces R1, R2 and the power wiring traces P1, P2 in a curing process (the steps of FIGS. 6A and 8A) during fabrication of the suspension board, "○" indicating that the adhesion is good is shown. In FIG. 9A, an image of the suspension board that has been evaluated to have good adhesion is shown.

On the one hand, for an example in which the cover layer 43 was stripped from the write wiring traces W1, W2, the read wiring traces R1, R2, or the power wiring traces P1, P2, "x" indicating that the adhesion is bad is shown. In FIG. 9B, an image of the suspension board that has been evaluated to have bad adhesion is shown.

As shown in the Table 1, in the suspension boards according to the inventive examples 1 to 4, the band characteristics were extremely good, and the adhesion was good. In the suspension boards according to the inventive examples 5 to 7, the band characteristics were particularly good, and the adhesion was good. In the suspension boards according to the inventive examples 8 to 11, the band characteristics were good, and the adhesion was good. Therefore, the performance of the suspension boards according to the inventive examples 1 to 11 is good.

On the one hand, while the band characteristics were extremely good in the suspension board according to the comparative example 1, the adhesion was bad. While the adhesion was good in the suspension boards according to the comparative examples 2 to 4, the band characteristics were bad. Therefore, the performance of the suspension boards according to the comparative examples 1 to 4 is bad.

From the above-mentioned results, in the case where the thickness of the metal thin film 15 is not more than 150 nm, it was confirmed that the band characteristics were good. Further, in the case where the thickness of the metal thin film 15 is smaller than 100 nm (not more than 90 nm in the present example), it was confirmed that the band characteristics were particularly good. In the case where the thickness of the metal thin film 15 is smaller than 50 nm (not more than 40 nm in the present example), it was confirmed that the band characteristics were extremely good. Further, in the case where the thickness of the metal thin film 15 is larger than 0 nm (not less than 10 nm in the present example), it was confirmed that the adhesion was good.

(7) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the present embodiment, the insulating layer 41 and the cover layer 43 are respectively examples of first and second insulating layers, the power wiring traces P1, P2, the read wiring traces R1, R2 or the write wiring traces W1, W2 are examples of a wiring trace. The metal thin film 15 is an example of a metal thin film, the connection terminals 21 to 26, 31 to 36 are examples of a connection terminal, the suspension board 1 is an example of a printed circuit board, the terminal portion 42b and the metal layer 44 are respectively examples of first and second conductor layers.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for various types of printed circuit boards.

We claim:
1. A printed circuit board comprising:
   a first insulating layer;
   a wiring trace formed on the first insulating layer;
   a metal thin film formed on the wiring trace;
   a second insulating layer formed on the first insulating layer to cover the metal thin film; and
   a connection terminal electrically connected to the wiring trace, and formed on the first insulating layer to be exposed from the second insulating layer, wherein the metal thin film has a thickness larger than 0 nm and not more than 150 nm, wherein the connection terminal includes a first conductor layer and a second conductor layer formed on the first conductor layer, the first conductor layer being integrally connected to the wiring trace, wherein the first conductor layer has a thickness smaller than a thickness of the wiring trace, wherein the second conductor layer has a thickness larger than the thickness of the metal thin film, and wherein the metal thin film and the first conductor layer are different layers.

2. The printed circuit board according to claim 1, wherein the metal thin film has a thickness smaller than 100 nm.

3. The printed circuit board according to claim 2, wherein the metal thin film has a thickness smaller than 50 nm.

4. The printed circuit board according to claim 1, wherein the metal thin film has a thickness of not less than 10 nm.

5. The printed circuit board according to claim 1, wherein an adhesive force of the metal thin film to the second insulating layer is higher than an adhesive force of the wiring trace to the second insulating layer.

6. The printed circuit board according to claim 5, wherein the wiring trace includes copper, and the metal thin film includes nickel, gold, platinum, silver or tin.

7. A method of manufacturing a printed circuit board, including the steps of:

forming a wiring trace on a first insulating layer;

forming a metal thin film having a thickness larger than 0 nm and not more than 150 nm on the wiring trace;

forming a second insulating layer on the first insulating layer to cover the metal thin film; and forming a connection terminal on a top surface of the first insulating layer to be electrically connected to the wiring trace and exposed from the second insulating layer, wherein the connection terminal includes a first conductor layer formed on the first insulating layer and a second conductor layer formed on the first conductor layer, the first conductor layer being integrally connected to the wiring trace, wherein the second conductor layer is formed after forming of the metal thin film, and wherein the first conductor layer has a thickness smaller than a thickness of the wiring trace.

8. The method of manufacturing the printed circuit board according to claim 7, wherein the metal thin film has a thickness smaller than 100 nm.

9. The method of manufacturing the printed circuit board according to claim 8, wherein the metal thin film has a thickness smaller than 50 nm.

10. The method of manufacturing the printed circuit board according to claim 7, wherein the metal thin film has a thickness of not less than 10 nm.

11. The method of manufacturing the printed circuit board according to claim 7, wherein the step of forming the wiring trace includes forming the first conductor layer integrally connected to the wiring trace, wherein the step of forming the metal thin film includes forming the metal thin film on the wiring trace and the first conductor layer, and removing the metal thin film formed on the first conductor layer, and wherein the step of forming the connection terminal includes forming the second conductor layer on the first conductor layer.

12. The method of manufacturing the printed circuit board according to claim 11, wherein removing the metal thin film includes removing a surface of the first conductor layer that comes into contact with the metal thin film, such that the thickness of the first conductor layer is smaller than the thickness of the wiring trace.

13. The method of manufacturing the printed circuit board according to claim 7, wherein the step of forming the metal thin film includes forming the metal thin film by electroless plating.

14. The printed circuit board according to claim 1, wherein the metal thin film is formed of nickel, and wherein the second conductor layer is formed of a stacked layer of nickel and gold.

15. A printed circuit board comprising:

a first insulating layer;

a wiring trace formed on the first insulating layer;

a metal thin film formed on the wiring trace;

a second insulating layer formed on the first insulating layer to cover the metal thin film; and a connection terminal electrically connected to the wiring trace, and formed on the first insulating layer to be exposed from the second insulating layer, wherein the metal thin film has a thickness larger than 0 nm and not more than 150 nm, wherein the connection terminal includes a first conductor layer and a second conductor layer formed on the first conductor layer, the first conductor layer being integrally connected to the wiring trace, the first conductor layer having a first surface in direct contact with the first insulating layer and an opposing second surface in direct contact with the second conductor layer, wherein the first conductor layer has a thickness smaller than a thickness of the wiring trace, and wherein the metal thin film and the second conductor layer are different layers.

16. The method of manufacturing the printed circuit board according to claim 7, wherein the metal thin film is formed of nickel, and wherein the second conductor layer is formed of a stacked layer of nickel and gold.

17. The printed circuit board according to claim 1, wherein the second conductor layer is formed on a surface of the first conductor layer which is exposed from the second insulating layer.

18. The method of manufacturing the printed circuit board according to claim 7, wherein the first conductor layer has a first surface in direct contact with the first insulating layer and an opposing second surface in direct contact with the second conductor layer, wherein the first surface of the first conductor layer has a first portion in direct contact with the first insulating layer, wherein the second conductor layer has a second portion exposed from the second insulating layer, and wherein the second portion overlaps with the first portion in a plan view viewed from a direction perpendicular to an exposed surface of the second conductor layer.

19. The printed circuit board according to claim 15, wherein the first surface of the first conductor layer has a first portion in direct contact with the first insulating layer, wherein the second conductor layer has a second portion exposed from the second insulating layer, and wherein the second portion overlaps with the first portion in a plan view viewed from a direction perpendicular to an exposed surface of the second conductor layer.

* * * * *